(12) United States Patent
Guo et al.

(10) Patent No.: US 8,670,741 B2
(45) Date of Patent: Mar. 11, 2014

(54) MIXER WITH HIGH SECOND-ORDER AND THIRD-ORDER INTERCEPT POINT

(75) Inventors: Yan Guo, Santa Clara, CA (US); Patrick T. Clancy, Santa Cruz, CA (US); Peter J. Mares, Fremont, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 14 days.

(21) Appl. No.: 13/333,925

(22) Filed: Dec. 21, 2011

(65) Prior Publication Data

US 2013/0165061 A1    Jun. 27, 2013

(51) Int. Cl.
*H04B 1/26*    (2006.01)
(52) U.S. Cl.
USPC ............ 455/326; 455/334; 455/323; 455/333
(58) Field of Classification Search
USPC .................. 455/323, 326, 333, 334; 375/219; 327/553
See application file for complete search history.

(56) References Cited

U.S. PATENT DOCUMENTS

| 5,280,648 | A | * | 1/1994 | Dobrovolny | ............... | 455/326 |
| 5,732,345 | A | | 3/1998 | Vice | | |
| 5,799,248 | A | | 8/1998 | Vice | | |
| 6,871,059 | B1 | | 3/2005 | Piro et al. | | |
| 7,982,533 | B2 | * | 7/2011 | Fan et al. | ...................... | 327/553 |
| 8,112,058 | B2 | * | 2/2012 | Kuo et al. | .................... | 455/326 |
| 8,121,579 | B2 | * | 2/2012 | Shiramizu et al. | ............ | 455/334 |
| 8,351,490 | B2 | * | 1/2013 | Chen et al. | .................... | 375/219 |

OTHER PUBLICATIONS

Balun Design (article). RF, RFIC & Microwave Theory, Design. http://www.rfic.co.uk; Dec. 26, 2006.
Maxim; "MAX2510 I/Q Modulator Performance in The Presence of DC Offset Voltages;" Application Note 1737; Wireless, RF, and Cable; Sep. 19, 2002.
Maxim; "High-Linearity, 1700MHz to 2200MHz Upconversion/Downconversion Mixer with LO Buffer/Switch;" 19-3468; Rev. 0; Oct. 2004.
Rosu, Iulian; "RF Mixers;" internet article; RF Technical Articles; http://www.qsl.net/va3iul; document created Jul. 18, 2009.

* cited by examiner

*Primary Examiner* — Junpeng Chen
(74) *Attorney, Agent, or Firm* — Schwabe, Williamson & Wyatt, P.C.

(57) ABSTRACT

Embodiments of apparatuses, systems and methods relating to a mixer having high second- and third-order intercept points are disclosed. Other embodiments may be described and claimed.

18 Claims, 6 Drawing Sheets

MIXER WITH HIGH SECOND-ORDER AND THIRD-ORDER INTERCEPT POINT

TECHNICAL FIELD

Embodiments of the present invention relate generally to the field of radio-frequency communication devices, and more particularly, to a mixer with high second-order and third-order intercept points.

BACKGROUND

Field-effect transistor (FET) mixers are used in radio-frequency (RF) communication devices to convert signals from one frequency range to another based on a local oscillator (LO) signal. For example, a FET mixer in a receive chain may shift a received RF signal into an intermediate frequency (IF) signal for further processing by the receiver circuitry. A FET mixer in a transmit chain may convert an IF signal into an RF signal for wireless transmission. Performance of a FET mixer may be judged by a variety of factors including isolation, ease of integration, power consumption, distortion, conversion efficiency, second-order intercept point, and third-order intercept point, etc.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
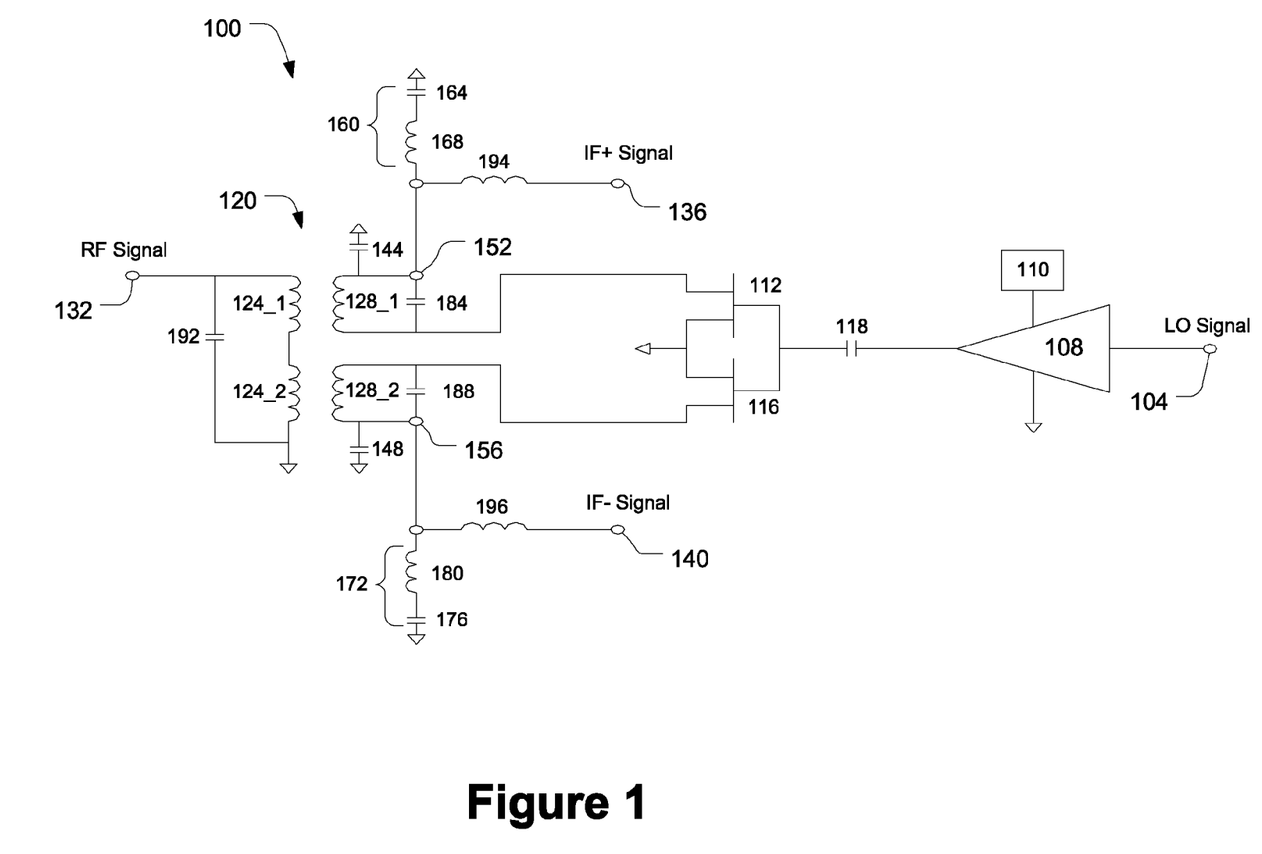
FIG. 1 illustrates a mixer in accordance with some embodiments.

FIG. 1 illustrates a mixer 100 in accordance with some embodiments. The mixer may include a node 104 that is to receive a local oscillator (LO) signal. The node 104 may be coupled with an amplifier 108 to amplify the LO signal. The amplifier 108 may be coupled with voltage supply 110 and ground. An output of the amplifier 108 may be coupled with a capacitor 118 to provide an amplified LO signal. The capacitor 118 may be coupled with gates of transistors 112 and 116 to provide the gates with an LO drive signal that is based on the amplified LO signal. The transistors 112 and 116 may be field-effect transistors (FETs) such as, but not limited to, metal semiconductor FETs (MESFETs), pseudomorphic high-electron mobility transistors (PHEMTs), metal-oxide-semiconductor FETs (MOSFET), etc. In an embodiment using a gallium arsenide (GaAs) technology, the capacitor 118 may work to level-shift the amplified LO signal in a manner such that the LO drive signal is centered around a FET pinch-off voltage of the transistors 112 and 116 to increase frequency conversion efficiency. In an embodiment using a silicon technology, the capacitor 118 may be a DC-blocking capacitor used in combination with an active biasing circuit that may be employed to bias the gates of the transistors 112 and 116 as desired.

The mixer 100 may further include a radio frequency (RF) balun 120. The RF balun 120 may include primary windings 124, including first primary winding 124_1 and second primary winding 124_2, and secondary windings 128, including first secondary winding 128_1 and second secondary winding 128_2. The first primary winding 124_1 may be electromagnetically coupled with first secondary winding 128_1, while the second primary winding 124_2 may be electromagnetically coupled with second secondary winding 128_2. The primary windings 124 and the secondary windings 128 may be designed to accommodate specifically-contemplated design frequencies of the RF signals and intermediate frequency (IF) signals. As used herein, design frequencies may be frequencies within design constraints of the mixer 100 for a particular signal.

The RF balun 120 may operate to differentially couple a single-ended RF signal at node 132 with drains of transistors 112 and 116. The RF balun 120 may be constructed as a compact balun with accurate amplitude and phase balance. The RF balun 120 may further, in conjunction with capacitors 144 and 148, as discussed below, operate as a diplexer to separate the single-ended RF signal, at node 132, and differential IF signal, at nodes 136 and 140 or nodes 152 and 156. The nodes 136 and 140 or nodes 152 and 156 may also be referred to as a differential IF signal interface.

At design frequencies of the IF signal, the secondary windings 128 may act as short circuits. Capacitors 144 and 148 may provide ground returns at design frequencies of the RF signal, while maintaining high impedances at design frequencies of the IF signal. This may allow the IF signal to be separated from the RF signal at nodes 152 and 156, which may also be referred to as RF grounding ports 152 and 156. Due at least in part to this method of separation of IF and RF signals at nodes 152 and 156, the impedance at nodes 152 and 156 may not affect a balance of the mixer 100.

In some embodiments, additional RF grounding at nodes 152 and 156 may be provided through the addition of LC segment 160, including capacitor 164 and inductor 168, and LC segment 172, including capacitor 176 and inductor 180. These LC segments may be designed to resonate at design frequencies of the RF signal to provide the additional RF grounding at nodes 152 and 156, respectively.

In various embodiments, capacitors 184, 188, and 192 may be coupled, in parallel, with first secondary winding 128_1, second secondary winding 128_2, and primary windings 124, respectively. The capacitors 184, 188, and 192 may facilitate tuning of the RF balun 120 at the desired RF frequency ranges. Furthermore, in some embodiments inductors 194 and 196 may be provided to increase RF-to-IF and LO-to-IF signal isolation.

The mixer 100 may be a monolithic mixer with all of the elements integrated in a single integrated circuit. The integrated circuit may have a substrate composed of a semiconductor material such as, but not limited to, gallium arsenide (GaAs), silicon, aluminum gallium arsenide (AlGaAs), gallium nitride (GaN), aluminum gallium nitride (AlGaN), indium phosphide (InP), silicon carbide (SiC), etc.

The mixer 100, as described, may have a number of high-performance characteristics. For example, the mixer 100 may have desirable linearity, e.g., a high IIP2 of greater than approximately 60 dBm and a high IIP3 of greater than approximately 30 dBm, and low conversion loss. Furthermore, these performance characteristics may be obtained while using relatively low LO drive levels allowing for integration of the amplifier 108 in the same integrated circuit with the remaining components of the mixer 100 while still using relatively low direct current (DC) power consumption as compared to a typical bipolar complementary metal oxide semiconductor (BiCMOS) quad FET mixer having comparable linearity.

The topology of the mixer 100 may allow for some flexibility as to the type of IF circuit differentially interfaced with mixer 100 at nodes 152 and 156 or nodes 136 and 140 such as differential IF amplifiers or various baluns such as, but not limited to, a lumped LC balun or a wire-wound balun.

Figure 2:
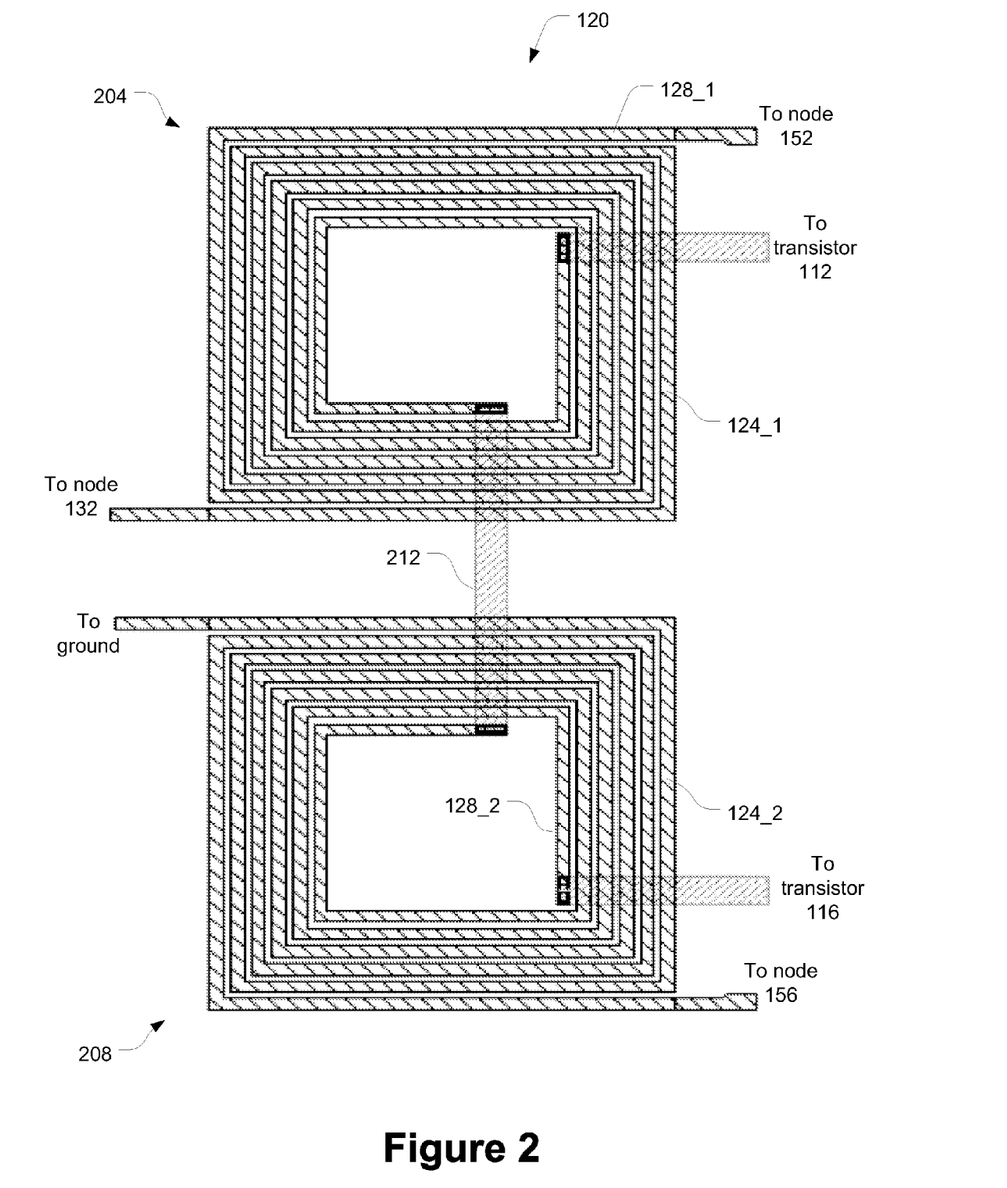
FIG. 2 illustrates a radio frequency balun in accordance with some embodiments.

FIG. 2 illustrates the RF balun 120 in accordance with some embodiments. The RF balun 120, as shown in FIG. 2, includes a first concentric structure 204 that has a pair of transmission lines concentrically oriented to implement the first primary winding 124_1 and the first secondary winding 128_1; and further includes a second concentric structure 208 that has another pair of transmission lines concentrically oriented to implement the second primary winding 124_2 and the second secondary winding 128_2. The first concentric structure 204 may be coupled with the second concentric structure 208 by a connection 212 that is coupled with the primary windings 124 at interior portions of the respective concentric structures. Other embodiments may use other types of RF baluns.

Figure 3:
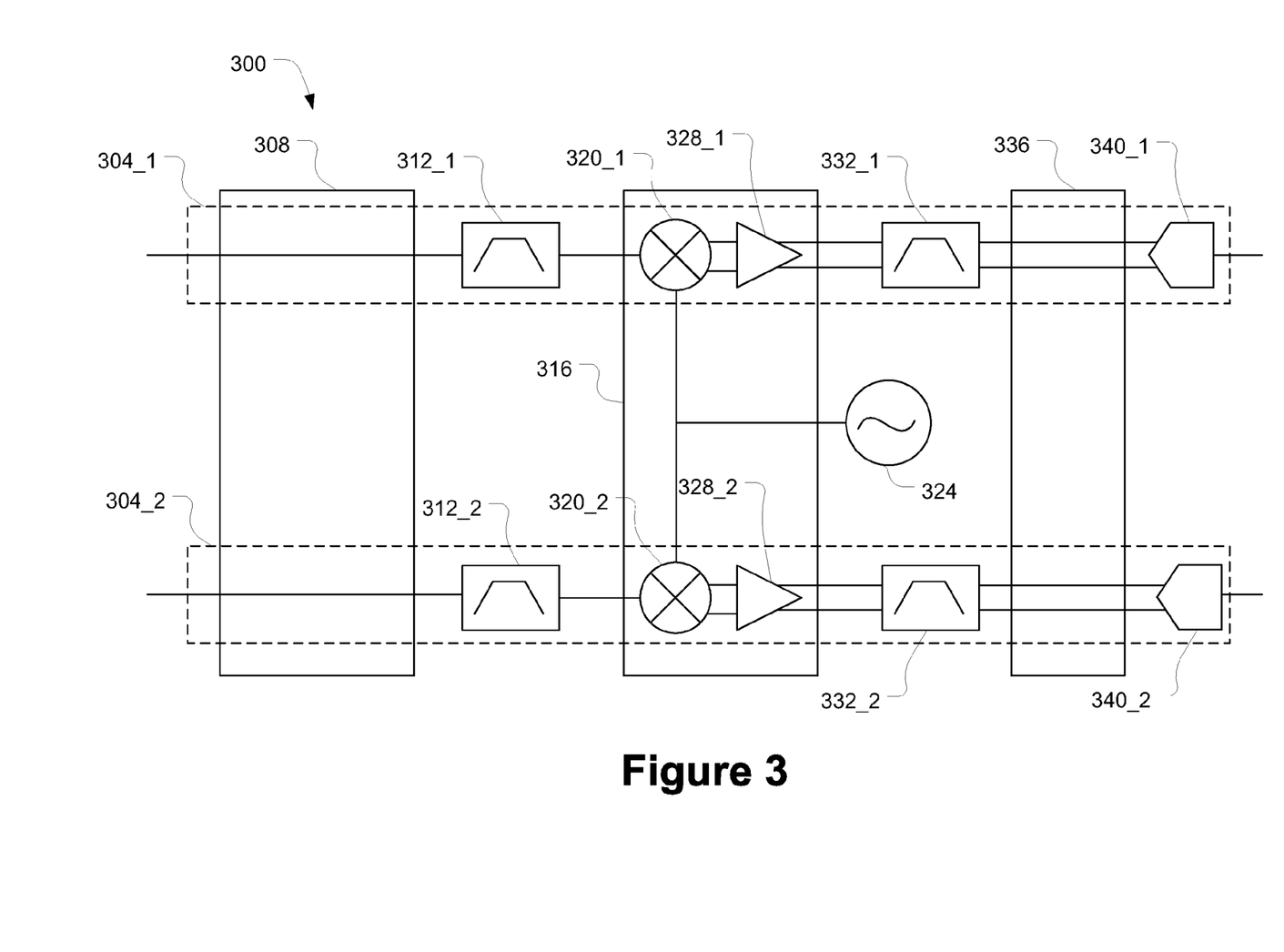
FIG. 3 illustrates a receiver in accordance with some embodiments.

FIG. 3 illustrates a receiver 300 in accordance with some embodiments. The receiver 300 may be a dual-channel receiver with receive channels 304_1 and 304_2. The receiver 300 may include an RF front-end 308 having circuitry configured to provide various signal processing operations with respect to RF signals received from one or more antennas. These signal processing operations may include, e.g., amplification, impedance matching, filtering etc.

Each of the receive channels 304 may include a bandpass filter 312_1 and 312_2 coupled with the RF front-end 308 and configured to provide a bandpass response to limit the RF signal to the desired design frequencies. The bandpass filters 312 may be coupled with a mixer block 316.

The mixer block 316 may include mixers 320, which may be similar to and substantially interchangeable with mixer 100 described above. In some embodiments, the mixer block 316 may be monolithically integrated into a single integrated circuit.

Mixer 320_1 may be coupled with the bandpass filter 312_1 and a local oscillator 324. Similarly, mixer 320_2 may be coupled with the bandpass filter 312_2 and the local oscillator 324. Each of the mixers 320 may be configured to generate a respective differential IF signal based on the LO signal, received from the local oscillator 324, and on respective single-ended RF signals received from the bandpass filters 312.

In some embodiments, the mixer block 316 may include output amplifiers 328 configured to amplify respective outputs of the mixers 320. Output amplifiers 328 may be coupled with respective bandpass filters 332 that are configured to provide bandpass responses to limit the respective differential IF signals to the desired design frequencies, which are typically lower frequencies than the RF signal design frequencies to facilitate signal processing operations.

The receiver 300 may further include an IF backend 336 coupled with the bandpass filters 332. The IF backend 336 may have circuitry configured to provide various signal processing operations with respect to the IF signals. These signal processing operations may include, e.g., amplification, impedance matching, filtering, etc.

The receiver 300 may further include analog-to-digital converters 340. The digital converter 340_1 may receive the analog IF signal of the receive channel 304_1 and convert it to a digital signal for further processing by, e.g., a baseband processing block. In a similar manner, digital converter 340_2 may receive the analog IF signal of the receive channel 304_2 and convert it to a digital signal for further processing by, e.g., a baseband processing block.

Figure 4:
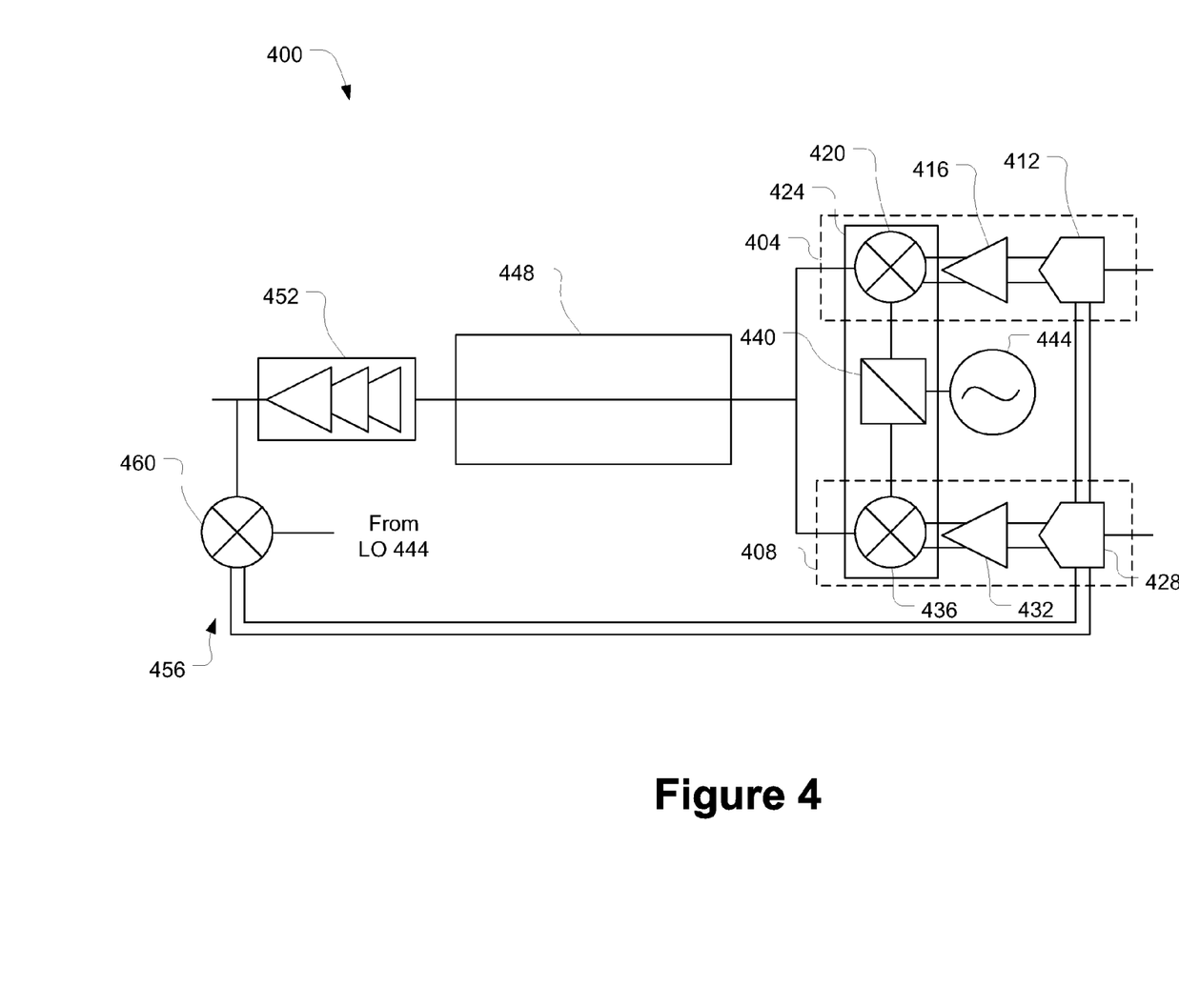
FIG. 4 illustrates a transmitter in accordance with some embodiments.

FIG. 4 illustrates a transmitter 400 in accordance with some embodiments. The transmitter 400 may include an IQ modulator having an in-phase (I) path 404 and a quadrature (Q) path 408.

The in-phase path 404 may include a digital-to-analog converter DAC 412 that receives a digital signal from, e.g., a baseband processor, that represents an in-phase portion of an IF signal to be transmitted. The DAC 412 may generate a differential analog signal that represents the in-phase portion of the IF signal to be transmitted. This signal may be provided to an amplifier 416 that amplifies the signal and provides it to a mixer 420 of mixer block 424.

Similarly, the quadrature path 408 may include a DAC 428 that receives a digital signal from, e.g., the baseband processor, that represents a quadrature portion of the IF signal to be transmitted. The DAC 428 may generate a differential analog signal that represents the quadrature portion of the IF signal to be transmitted. The signal may be provided to an amplifier 432 that amplifies the signal and provides it to a mixer 436 of the mixer block 424.

The mixer block 424, similar to mixer block 316, may be monolithically integrated into a single integrated circuit. The mixer block 424 may include a splitter 440 that receives an LO signal from a local oscillator 444. The splitter 440 may provide a first LO signal to the mixer 420 and a second LO signal, which is out of phase from the first LO signal by ninety degrees, to the mixer 436. The mixers 420 and/or 436 may be similar to and substantially interchangeable with mixer 100.

The mixers 420 and 436 may output respective RF signals that are combined and provided to RF front-end 448. The RF front-end 448 may include circuitry that conditions the RF signal by, e.g., filtering the RF signal. The RF front-end 448 may provide the conditioned RF signal to a power amplifier 452 that amplifies the RF signal for subsequent over-the-air transmission.

In some embodiments, the transmitter 400 may also include a transmit observation path 456 that includes another mixer 460. The mixer 460 may generate a differential IF signal based on the RF signal that is output from the power amplifier 452. This IF signal may be fed back to the DACs 412 and 428 and may be used to adjust various transmit characteristics of the transmitter 400.

The mixer 460 may include a similar topology, or a different topology from the mixers 420 and 436. In some embodiments, the mixer 460 may be incorporated into the mixer block 424 with the mixers 420 and 436.

Figure 5:
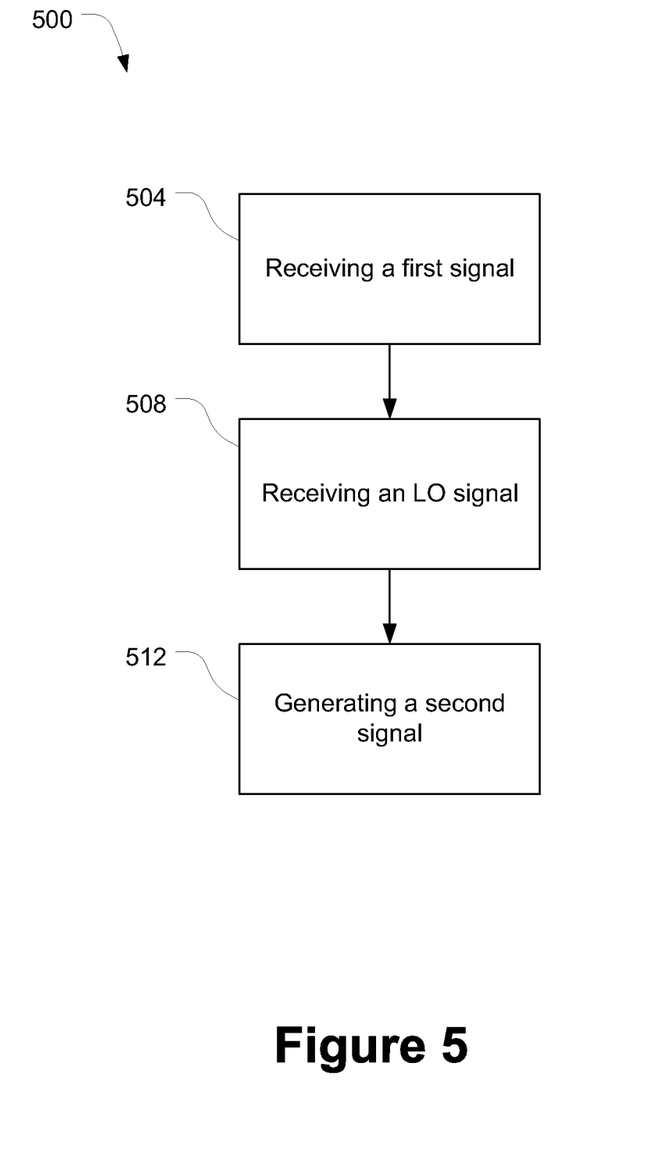
FIG. 5 is a flowchart depicting a frequency conversion operation in accordance with some embodiments.

FIG. 5 is a flowchart depicting a frequency conversion operation 500 that may be done by any of the above-described mixers in accordance with some embodiments. At block 504, the frequency conversion operation 500 may include receiving a first signal. In an embodiment in which the frequency conversion operation 500 is done in the context of a transmit operation, the receiving of the first signal may be receiving, by a mixer, e.g., mixer 100, a differential IF signal. In an embodiment in which the frequency conversion operation 500 is done in the context of a receive operation, the receiving of the first signal may be receiving, by a mixer, e.g., mixer 100, a single-ended RF signal.

At block 508, the frequency conversion operation 500 may include receiving an LO signal. In some embodiments the LO signal may be conditioned by, e.g., being amplified with an amplifier such as amplifier 108.

At block 512, the frequency conversion operation 500 may include generating a second signal. The generating of the second signal may be based on the first signal, received at block 504, and the LO signal, received at block 508.

In an embodiment in which the frequency conversion operation 500 is done in the context of a transmit operation, the generating of the second signal may be generating, by a mixer, e.g., mixer 100, a single-ended RF signal based on the LO signal and the differential IF signal. In an embodiment in which the frequency conversion operation 500 is done in the context of a receive operation, the generating of the second signal may be generating, by a mixer, e.g., mixer 100, a differential IF signal based on the LO signal and the single-ended RF signal.

Figure 6:
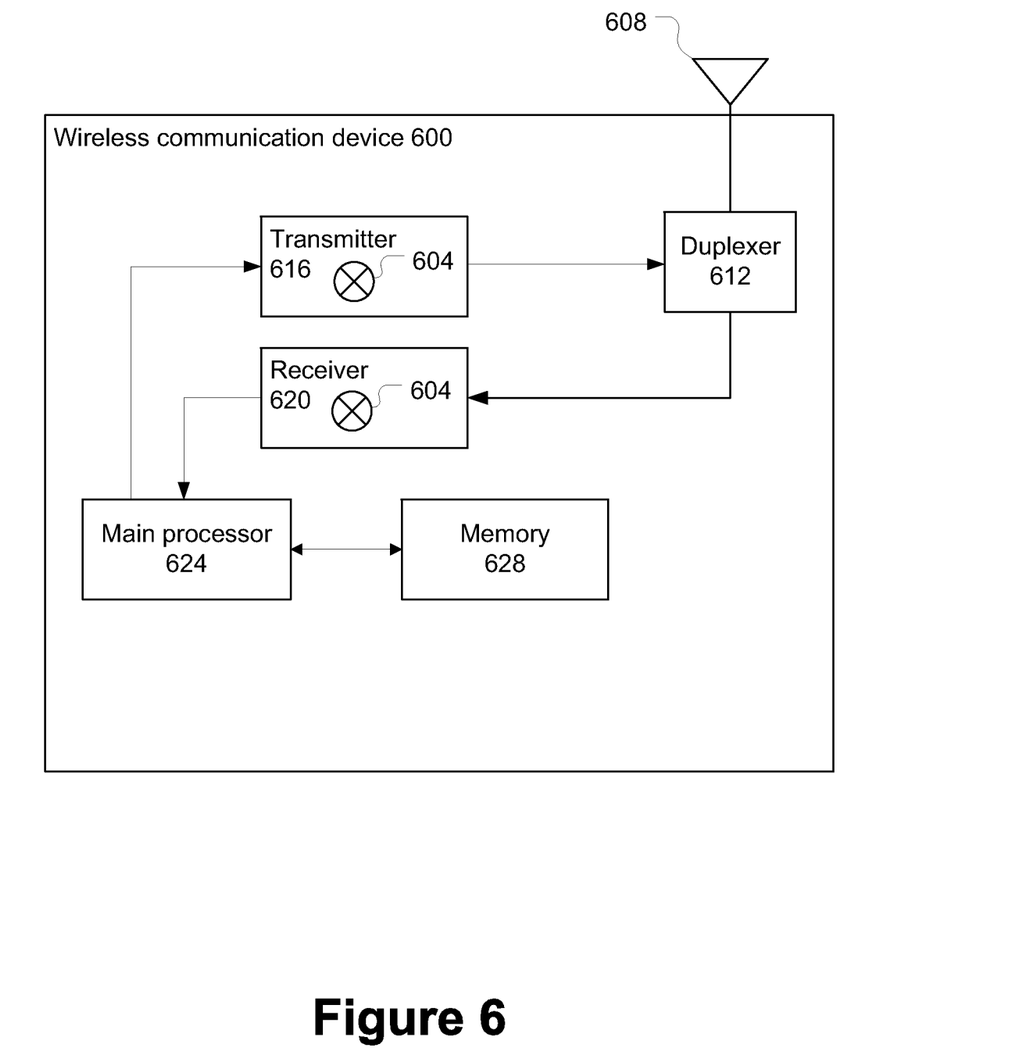
FIG. 6 illustrates a wireless communication device in accordance with some embodiments.

A block diagram of an exemplary wireless communication device 600 incorporating one or more mixers 604, which may be similar to mixers 100, 320, 420, 436, and/or 460. The wireless communication device 600 may further include an antenna structure 608, a duplexer 612, a transmitter 616, a receiver 620, a main processor 624, and a memory 628 coupled with each other at least as shown. The mixers 604 are shown as being in both the transmitter 616 and the receiver 620; however, other embodiments may have mixers 604 in one or the other. Further, while the wireless communication device 600 is shown with transmitting and receiving capabilities, other embodiments may include devices with only receiving or transmitting capabilities.

In various embodiments, the wireless communication device 600 may be, but is not limited to, a mobile telephone, a paging device, a personal digital assistant, a text-messaging device, a portable computer, a desktop computer, a base station, a subscriber station, an access point, a radar system, a satellite communication device, or any other device capable of wirelessly transmitting/receiving RF signals and benefitting from frequency conversion operations as described herein.

The main processor 624 may execute a basic operating system program, stored in the memory 628, in order to control the overall operation of the wireless communication device 600. For example, the main processor 624 may control the reception of signals by receiver 620 and the transmission of signals by transmitter 616. The main processor 624 may be capable of executing other processes and programs resident in the memory 628 and may move data into or out of memory 628, as desired by an executing process.

The transmitter 616, which may be similar to and substantially interchangeable with transmitter 400 in some embodiments, may receive outgoing data (e.g., voice data, web data, e-mail, signaling data, etc.) from the main processor 624 and may generate RF signal(s) to represent the outgoing data. The RF signals may then be provided to the duplexer 612 and transmitted over the air by the antenna structure 608.

The receiver 620, which may be similar to and substantially interchangeable with receiver 300, may receive the incoming RF signals and provide incoming data transmitted by the RF signals to the main processor 624 for further processing.

In various embodiments, the antenna structure 608 may include one or more directional and/or omnidirectional antennas, including, e.g., a dipole antenna, a monopole antenna, a patch antenna, a loop antenna, a microstrip antenna or any other type of antenna suitable for over-the-air transmission/reception of RF signals.

Those skilled in the art will recognize that the wireless communication device 600 is given by way of example and that, for simplicity and clarity, only so much of the construction and operation of the wireless communication device 600 as is necessary for an understanding of the embodiments is shown and described. Various embodiments contemplate any suitable component or combination of components performing any suitable tasks in association with wireless communication device 600, according to particular needs. Moreover, it is understood that the wireless communication device 600 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:
1. A mixer comprising:
  first and second transistors, wherein the first transistor has a gate configured to receive a local oscillator (LO) drive signal, a source coupled with ground, and a drain, and the second transistor has a gate configured to receive the LO drive signal, a source coupled with ground, and a drain;

a radio-frequency (RF) balun having primary and secondary windings, with the primary windings coupled with an RF signal node, a first secondary winding of the secondary windings coupled with a first intermediate frequency (IF) signal node, and a second secondary winding of the secondary windings coupled with a second IF signal node, wherein the first and second IF signal nodes are configured to provide a differential IF signal interface;

a first capacitor coupled with the first secondary winding and configured to provide a ground return at a first RF grounding port for an RF signal; and a second capacitor coupled with the second secondary winding and configured to provide a ground return at a second RF grounding port for the RF signal.

2. The mixer of claim 1, further comprising:
an amplifier configured to amplify a LO signal,
wherein the LO drive signal is based on the amplified LO signal.

3. The mixer of claim 2, further comprising:
a capacitor coupled with the amplifier and the first and second transistors and configured to provide the LO drive signal based on the amplified LO signal.

4. The mixer of claim 1, wherein the first secondary winding is coupled with a drain of the first transistor and the second secondary winding is coupled with a drain of the second transistor.

5. The mixer of claim 1, further comprising:
a diplexer including the RF balun, the first capacitor, and the second capacitor and configured to diplex the RF signal and an IF signal.

6. The mixer of claim 5, further comprising:
a plurality of capacitors to facilitate tuning RF balun at desired frequencies, the plurality of capacitors including a third capacitor coupled in parallel with the first secondary winding, a fourth capacitor coupled in parallel with the second secondary winding, and a fifth capacitor coupled in parallel with the first and the second primary windings.

7. The mixer of claim 1, wherein the RF signal is a single-ended signal.

8. The mixer of claim 1, further comprising:
a first inductor-capacitor segment coupled with the first RF grounding port and ground and configured to resonate at the RF signal to further ground the RF signal; and
a second inductor-capacitor segment coupled with the second RF grounding port and ground and configured to resonate at the RF signal to further ground the RF signal.

9. The mixer of claim 1, wherein the mixer is a monolithic mixer with the first and second transistors and the RF balun integrated in a single integrated circuit.

10. The mixer of claim 1, wherein the mixer has a second-order intercept point of greater than approximately 60 dBm and a third-order intercept point greater than approximately 30 dBm.

11. The mixer of claim 1, wherein the RF balun is a balun that includes a first concentric structure coupled with a second concentric structure.

12. The mixer of claim 11, further comprising:
a connection to couple the first and second concentric structures at interior portions of the first and second concentric structures.

13. The mixer of claim 1, including a first inductor coupled with the first IF signal node and a second inductor coupled with the second IF signal node, wherein the first and second inductors are configured to increase an RF-to-IF and LO-to-IF signal isolation.

14. A receiver comprising:
a first channel having a first mixer configured to receive a first single-ended radio frequency (RF) signal and an amplified local oscillator (LO) signal and to generate a first differential intermediate frequency (IF) signal, the first mixer including an RF balun with primary windings coupled with a node to receive the first single-ended RF signal and secondary windings coupled with IF nodes to output the first differential IF signal, the secondary windings further coupled with a pair of transistors configured to receive an LO drive signal that is based on the LO signal, wherein the first mixer comprises a first RF grounding port coupled with a first secondary winding and a second RF grounding port coupled with a second secondary winding; and
a second channel having a second mixer configured to receive a second single-ended RF signal and the LO signal and to generate a second differential IF signal.

15. The receiver of claim 14, further comprising:
a mixer block, having the first and second mixers, that is monolithically integrated into a single integrated circuit.

16. The receiver of claim 14, wherein the second mixer comprises:
an RF balun with primary windings coupled with a node to receive the second single-ended RF signal and secondary windings coupled with IF nodes to output the second differential IF signal, the secondary windings further coupled with drains from a pair of transistors configured to receive an LO drive signal that is based on the LO signal.

17. The receiver of claim 14, wherein the first channel further includes an amplifier input coupled with a local oscillator and output coupled with capacitor, with the capacitor coupled to the gates of the pair of transistors to receive the LO drive signal, wherein the LO drive signal is based on the amplified LO signal.

18. The receiver of claim 14, wherein the mixer further comprises:
a first capacitor coupled with ground and the first RF grounding port; and
a second capacitor coupled with ground and the second RF grounding port.

* * * * *

UNITED STATES PATENT AND TRADEMARK OFFICE
CERTIFICATE OF CORRECTION

PATENT NO. : 8,670,741 B2  Page 1 of 1
APPLICATION NO. : 13/333925
DATED : March 11, 2014
INVENTOR(S) : Yan Guo et al.

It is certified that error appears in the above-identified patent and that said Letters Patent is hereby corrected as shown below:

In the Claims:

Col. 7, line 33 [Claim 6.] "...tuning RF balun..." should read – "...tuning the RF balun..."

Signed and Sealed this
Twenty-third Day of June, 2015

Michelle K. Lee
*Director of the United States Patent and Trademark Office*